United States Patent [19]

Boudon et al.

[11] 4,394,752
[45] Jul. 19, 1983

[54] DECODING AND SELECTION CIRCUIT FOR A MONOLITHIC MEMORY

[75] Inventors: Gérard Boudon; Bernard Denis, both of Mennecy; Virginie de Grivel, Neuilly; Pierre Mollier, Saint Fargeau Ponthierry, all of France

[73] Assignee: International Business Machines Corporation, Armonk, N.Y.

[21] Appl. No.: 276,136

[22] Filed: Jun. 22, 1981

[30] Foreign Application Priority Data

Sep. 26, 1980 [EP] European Pat. Off. ............ 80430019

[51] Int. Cl.³ .............................................. G11C 7/00
[52] U.S. Cl. .................................... 365/227; 365/230
[58] Field of Search ............... 365/154, 155, 156, 174, 365/179, 189, 190, 227, 230

[56] References Cited

U.S. PATENT DOCUMENTS 4,007,451 2/1977 Heuber et al. ...................... 365/190
4,295,210 10/1981 Beranger et al. .................... 365/227

OTHER PUBLICATIONS

V. Marcello et al., "Decode Circuit with Up-Level Clamp" vol. 20 No. 11A, Apr. 1978, pp. 4406-4408, *IBM Technical Disclosure Bulletin*.

J. A. Dorler et al., "Complementary Transistor Switch Memory Cell", vol. 16, No. 12, May 1974, pp. 3931-3932, *IBM Technical Disclosure Bulletin*.

*Primary Examiner*—Joseph A. Popek
*Attorney, Agent, or Firm*—Stephen J. Limanek

[57] ABSTRACT

A word line selection circuit includes a conventional Schottky diode decoder and a driver transistor which is connected to a word line. A word line is selected when the transistor is conductive and all associated diodes of the decoder are off. The base current of the driver transistor is defined by a control transistor whose conductivity is opposite to that of the driver transistor and which applies the selection current to the base of the driver transistor. A regulating transistor forms a current mirror with the control transistor to regulate the selection current. A compensation circuit associated with the regulating transistor modulates the collector current of the regulating transistor as a function of the driver transistor factor.

8 Claims, 4 Drawing Figures

DECODING AND SELECTION CIRCUIT FOR A MONOLITHIC MEMORY

DESCRIPTION

TECHNICAL FIELD

The present invention relates to a high-performance decoding and selection circuit to be used for any type of monolithic memory, e.g., a read-only memory (ROM) or random access memory (RAM) and a reference voltage generator therefor.

A number of systems, for example computers and microprocessors, require a plurality of memories and these elements must, therefore, be produced at low cost and at the smallest possible size. Power dissipation is one of the problems arising when the integration density increases.

BACKGROUND ART

Commonly assigned U.S. patent application Ser. No. 71,826, filed on Sept. 4, 1979, by H. L. Beranger, C. Marzin, D. M. Omet and J. L. Peter, entitled "Power Supply System for Monolithic Cells", now U.S. Pat. No. 4,295,210, relates to a monolithic memory where power dissipation has been reduced by applying to the selected cells a voltage higher than the supply voltage of non-selected cells, which is made possible by using current switching circuits.

The decoding and selection circuits as described in an article published in the IBM Technical Disclosure Bulletin, Vol. 20, No. 11A, April 1978, pages 4406 to 4408, generally use a driver transistor associated with each word line and an address decoding circuit with diodes, the driver transistor becoming conductive when the corresponding word line is selected. A resistor is connected to the transistor base and to the common point at the anodes of the decoder diodes in order to supply the selection current to the transistor base when the line is selected. At that time all diodes are off. If the line is not selected, at least one of the decoder diodes becomes conductive and the current in the resistor is deviated by the conducting diodes.

The disadvantage of such a circuit is that the resistor causes considerable power dissipation.

DISCLOSURE OF THE INVENTION

Consequently, one object of the present invention is to produce a decoding and selection circuit which allows power dissipation to be reduced in a highly integrated monolithic memory.

Another object of the present invention is to produce a decoding and selection circuit requiring only a low supply voltage.

Another object of the present invention is to produce a decoding and selection circuit which enables fast selection.

Another object of this invention is to produce a reference voltage generator which maintains the base current of the driver transistor at a minimum value.

According to the invention, the word line selection circuit comprises a conventional Schottky diode decoder and a driver transistor which is connected to the word lines. A word line is selected when the transistor is conductive and all diodes are off.

The base current of the driver transistor is defined by a so-called control transistor whose conductivity is opposite to that of the driver transistor and which supplies the selection current to the driver transistor base. For example, if the driver transistor is of the NPN type, the control transistor is of the PNP type and the base current of the driver transistor is the collector current of the control transistor.

A regulating transistor forms a current mirror with the control transistor to regulate the selection current. A compensation circuit associated with the regulating transistor modulates the collector current of the regulating transistor as a function of the driver transistor factor.

The foregoing and other objects, features and advantages of the invention will be apparent from the following and more particular description of a preferred embodiment of the invention, as illustrated in the accompanying drawings.

BEST MODE FOR CARRYING OUT THE INVENTION

Figure 1:
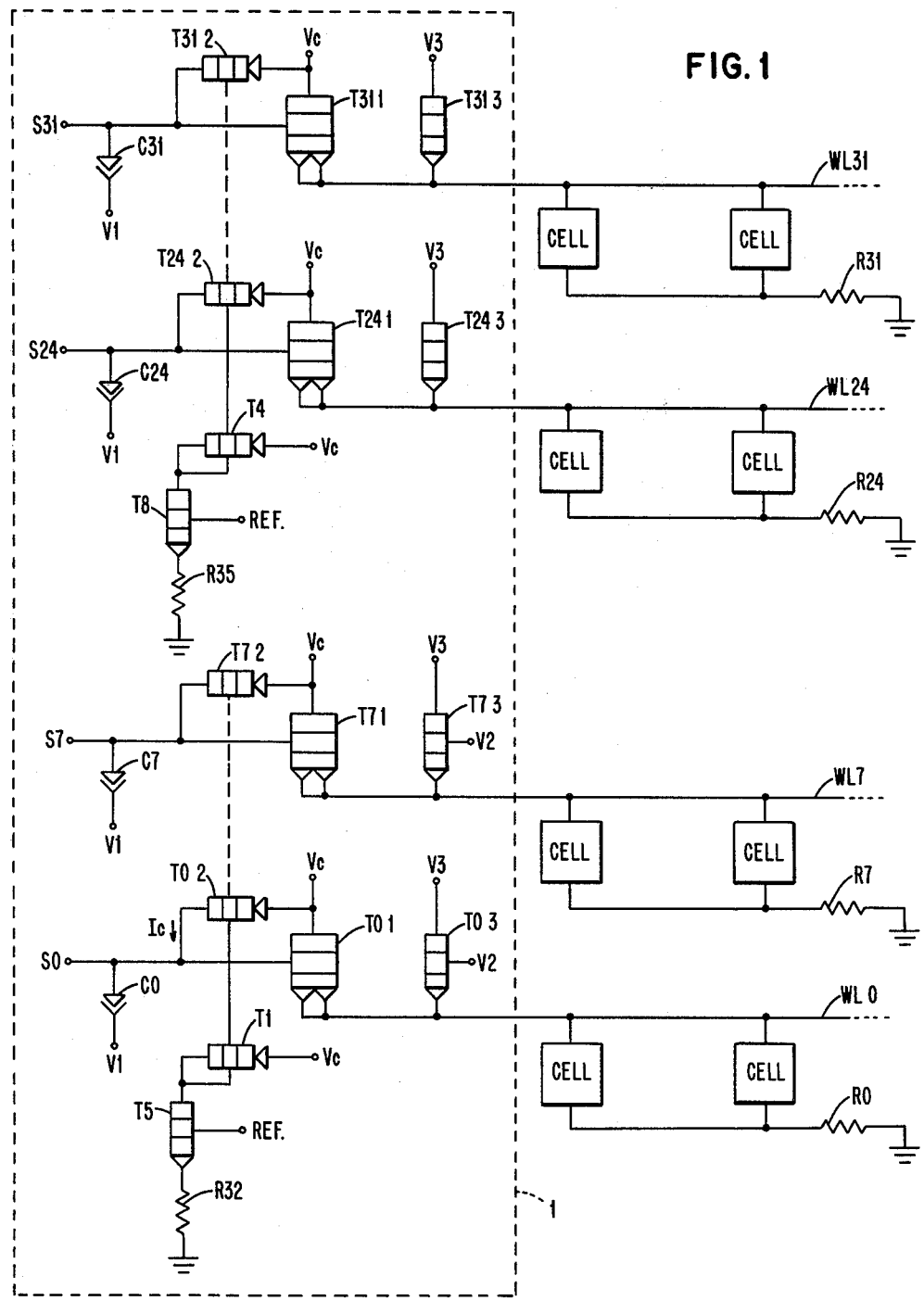
FIG. 1 illustrates the selection circuit according to the present invention.
Figure 3:
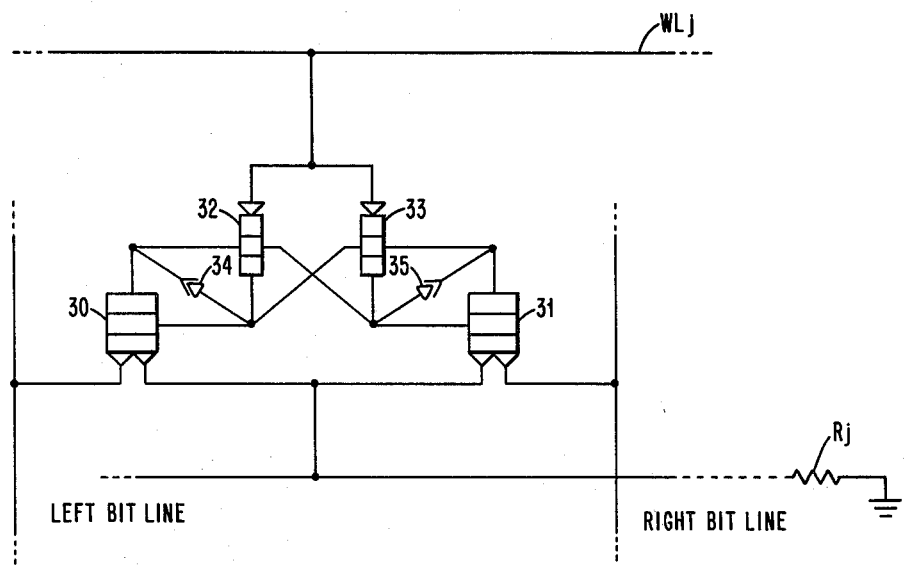
FIG. 3 illustrates a memory cell which can be included in the array of FIG. 1.

An array according to the present invention is used to select one word line of a plurality of word lines WL0 to WLn in a memory which includes a matrix of cells CELL arranged in rows and columns, as indicated in FIG. 1 of the drawings. For the purpose of clarity, only lines WL0, WL7, WL24 and WL31 have been represented. The cells CELL may be of any type, for example, conventional Harper cells or PNP Harper cells such as illustrated in FIG. 3. The cell of FIG. 3 is connected to a word line WLj and a pair of bit lines. The cells of the matrix are also connected to ground via resistors R0 to R31, as indicated in FIG. 1 of the drawings. A word line is selected by increasing the potential of the line to be selected.

Figure 2:
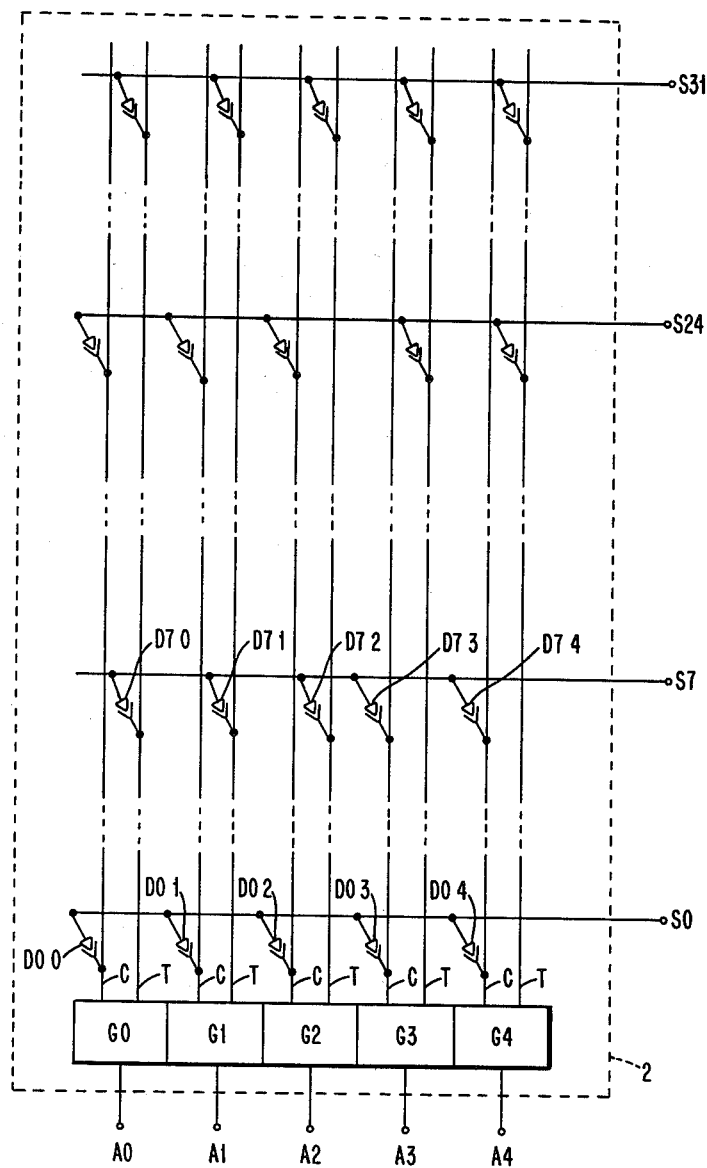
FIG. 2 shows an address decoding circuit which can be used to control the selection circuit of FIG. 1.

The selection takes place by means of selection circuit 1 illustrated in FIG. 1 which is controlled by address decoding circuit 2 illustrated in FIG. 2 of the drawings.

As shown in FIG. 2, the binary address signals A0 to A14 are applied to true/complement value generators G0 to G4. Each generator provides to one of its outputs T the value of the input signal and to the other output, referenced by C, the complement of the input signal. Decoding of the address signals is performed by means of the Schottky diodes arranged in a matrix, whereby the cathode of a diode is connected to one of the true/complement value outputs of a generator and the anode of the diode is connected to one of the horizontal lines S0 to S31, all of which are not illustrated.

For example, the cathodes of diodes D0 0, D0 1, D0 2, D0 3 and D0 4 are connected to the complement outputs of generators G0 to G4. Thus, if the address signal 00000 is applied to inputs A0 to A4, diodes D0 0 to D0 4 are off. The diodes connected to different S lines are arranged so as to be off when the corresponding address signal is applied to inputs A0 to A4. Five address digits allow the selection of 32 lines 0 to 31; if the memory includes more word lines, further address digits must be added.

Lines S0 to S31 are connected to the inputs of selection circuit 1, as indicated in FIG. 1. The selection circuit elements corresponding to the selection of a word line WLj are referred to by a letter followed by suffix j and a reference number.

The anodes of Schottky clamping diodes C0 to C31 are connected to lines S0 to S31, respectively, and their cathode is connected to a supply voltage V1 of 2.2 volts.

The selection circuit of line WL0 includes a double-emitter NPN driver transistor T0 1 the base of which is connected to selection line S0, the collector of which is connected to a voltage supply Vc of 3.4 volts according to a preferred embodiment of the invention, and the emitters of which are connected to the word line WL0.

The emitter of PNP control transistor T0 2 is connected to the collector of transistor T0 1, whereas its collector is connected to the base of transistor T0 1. Transistor T0 2 is arranged as a current mirror with a regulating PNP transistor T1, that is, its base is connected to the base of transistor T1. The base and the collector of transistor T1 are connected together and its emitter is connected to voltage Vc. A current source including transistor T5 and a resistor R32 is connected to transistor T1. The collector of transistor T5 is connected to the collector of transistor T1, its emitter is connected to a first terminal of resistor R32, the second terminal of which is connected to ground. The base of transistor T5 is connected to a reference voltage REF supplied by a generator which will be described with reference to FIG. 4 of the drawings.

The bases of the eight transistors T0 2 to T7 2 are connected together to the base of transistor T1. A 32-word line memory thus contains four transistor groups T0 2 to T7 2, T8 2 to T15 2, T16 2 to T23 2 and T24 2 to T31 2 and, consequently, there are four circuits T1, T5, R32 to T4, T8, R35, only two of which are indicated in FIG. 1 of the drawings. These figures are, of course, only given as an example; other figures can be chosen depending on the possible embodiments.

An additional transistor T0 3 is mounted as a current switch with transistor T0 1. The emitters of transistors T0 3 and T0 1 are connected together, whereas the base of transistor T0 3 is connected to a reference voltage V2 and its collector to a low supply voltage V3. In a preferred embodiment of the invention, the preferred voltage V2 equals 1.9 volts and voltage V3 equals 1.7 volts. Transistor T0 3 feeds the word line to which it is connected if it has not been selected according to the method described in the commonly assigned U.S. patent identified hereinabove.

The circuits illustrated in FIGS. 1 and 2 operate as follows.

Assuming that word line WL0 is to be selected, address digits 00000 are applied to inputs A0 to A4. Diodes D0 0 to D0 4 are thus off so that in all other diode rows of the decoding matrix at least one diode is conductive.

As a result, collector current Ic of transistor T0 2 is applied to the base of transistor T0 1 which is thus made conductive. Therefore, transistor T0 3 which was conductive when the line was not selected is off and the voltage on the word line increases from 1.2 volts to 2.0 volts, causing the selected word line WL0 to be appropriately charged.

Transistor T1 associated with current source T5 permits collector current Ic in transistor T0 2 to be regulated so that it is independent of the variations of supply voltage Vc.

In the other non-selected lines, at least one of the Schottky diodes of the decoding matrix is conductive, for example, diodes D7 0 to D7 2 are conductive for line WL 7. Consequently, the collector current of transistor T7 2 passes into these diodes, thus blocking transistor T7 1. This is the case for all other lines.

FIG. 3 illustrates the diagram of a cell that can be used for the decoding and selection circuits such as shown in FIGS. 1 and 2; but, it should be understood that the principle of the present invention applies to any other type of cell to be used in a random access memory or a read-only memory. Reference can be made to the IBM Technical Disclosure Bulletin, Vol. 16, No. 12, May 1974, pages 3931 to 3932, which describes such a cell.

The cell includes two transistors with coupled emitters 30 and 31 as in a conventional Harper cell. PNP transistors 32 and 33 are arranged as loads instead of using resistors of the conventional cell. The emitters of transistors 32 and 33 are connected to the word line WLj and the coupled emitters of transistors 30 and 31 are connected to ground via resistor Rj. The other emitter of transistor 30 is connected to the left bit line and the other emitter of transistor 31 is connected to the right bit line. Two Schottky diodes 34 and 35 are associated with transistors 30, 32 and 31, 33 respectively.

The anode of diode 34 is connected to the base of transistor 30 and to the collector of transistor 32 and its cathode is connected to the base of transistor 32 and to the collector of transistor 30. Diode 35 and transistors 31 and 33 are similarly arranged.

The cell acts as a switch in which the binary data 1 or 0 to be memorized or stored is represented by the state of transistors 30 and 31.

In the following, reference is made to FIG. 4 to describe a voltage generator which can be used to supply voltage REF to the base of transistors T5 to T8. In a 32-word-line memory array, four similar generator circuits are required.

Figure 4:
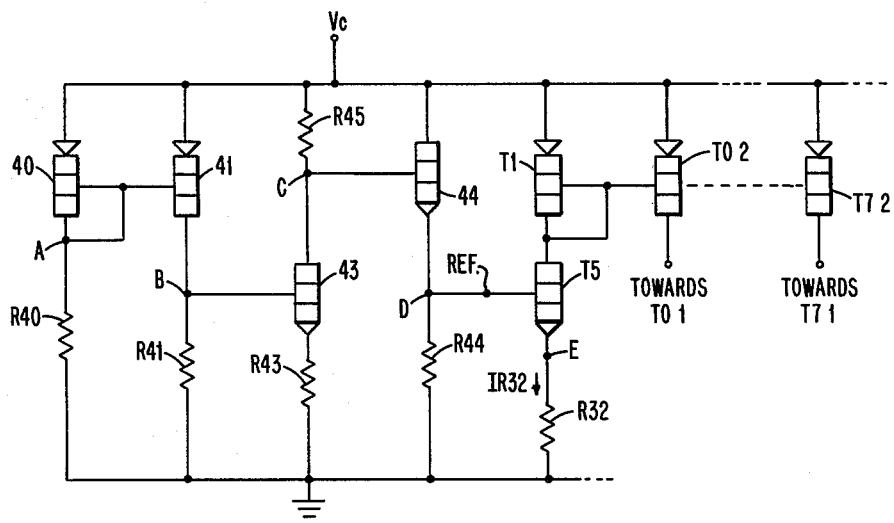
FIG. 4 represents a reference voltage generator supplying a voltage REF for the circuit of FIG. 1.

FIG. 4 represents the circuit associated with transistor T5 used to regulate collector currents Ic of transistors T0 2 to T0 7 mounted in parallel with transistor T1. Regulation is performed by modulating collector current Ic of transistor T1 as a function of gain factor $\beta$ of the PNP transistors.

The circuit of FIG. 4 comprises two transistors 40 and 41 associated with two resistors R40 and R41 of the same value. Transistors 40 and 41 are mounted as current mirrors, whereby their emitters are connected to voltage Vc, their bases are connected together, and the base of transistor 40 is connected to its collector. The collectors of transistors 40 and 41 are connected to ground via resistors R40 and R41, respectively. As a result of this layout, they have the same collector current flow as transistors T1, T0 2 to T7 2, if R40=R41=7k ohms.

A voltage is generated at node B, representing the common point between the collector of transistor 41 and resistor R41, as a function of the factor $\beta$ of the PNP transistors. This voltage is used to regulate collector current Ic through transistors 43, 44, T5 and T1.

The base of transistor 43 is connected to node B, whereas its emitter is connected to ground by a resistor R43, and its collector to voltage Vc via a resistor R45. Node C at the collector of transistor 43 is connected to the base of transistor 44. The collector of transistor 44 is connected to voltage Vc and its emitter, node D, is connected to ground via a resistor R44. The reference voltage REF is tapped at node D.

The current IR32 to be regulated in resistor R32 is equal to:

$$IR32 = (1 + 9/\beta) Ic \qquad (1)$$

where $\beta$ is the gain factor of the nine PNP transistors, T1, T0 2 to T7 2 and Ic is the collector current of T1.

Assuming the current Ic to be regulated is 0.35 mA, current IR32 must vary in order to exactly compensate for the factor $\beta$ of the PNP transistors according to expression (1) so that:

| $\beta$ | 3 | 9 | 18 |
|---|---|---|---|
| IR32 | 1.4mA | 0.7mA | 0.52mA |

The collector currents of transistors 40 and 41 which have their emitters and bases in common are equal and are chosen so as to be equal to current Ic wherein R40=R41=7k ohms.

The variation of voltage $V_B$ at node B is determined by the following expression:

$$IR40 = \frac{Vc - V_{BE}}{R40} = Ic(40) (1 + 2/\beta)$$

where $V_{BE}$ is the emitter voltage of a transistor.

$$V_B + R41 \times Ic(40) = \frac{R41}{R40}\left(\frac{Vc \, V_{BE}}{1 + 2/\beta}\right) \qquad (2)$$

Assuming $V_{BE}$=0.75 volts and Vc=3.4 volts, it is possible to deduce the following variation of $V_B$ as a function of factor $\beta$.

| $\beta$ | 3 | 9 | 18 |
|---|---|---|---|
| $V_B$ | 1.59 | 2.17 | 2.385 |

It can be seen that the voltage at node B increases with the factor $\beta$ of the PNP transistors, whereas the voltage to be generated at the R32 terminals E decreases when $\beta$ increases.

The circuit composed of transistor 43 and resistors R43 and R45 is used to reverse or invert the voltage at node B.

At node E, the voltage across resistor R32 is equal to:

$$V_E = Vc - 2V_{BE} - V_C = Vc - 2V_{BE} - \left[(V_B - V_{BE})\frac{R45}{R43}\right] \qquad (3)$$

$$V_E = Vc - V_{BE}\left[2 - \frac{R45}{R43}\right] - V_B\frac{R45}{R43}$$

A current calculation using expression (1) and expression (3) shows that the derivative $dIc/d\beta$ is zero if the ratio R45/R43 equals 0.86. The following table, showing that current Ic remains virtually constant whatever factor $\beta$ may be, is obtained with R32=0.84k ohms.

| $\beta$ | 3 | 9 | 18 |
|---|---|---|---|
| $V_E(V)$ | 1.178 | 0.688 | 0.494 |
| IR32(mA) | 1.4 | 0.81 | 0.59 |
| Ic(mA) | 0.35 | 0.40 | 0.39 |

Owing to the decoder layout of the present invention, it is possible to obtain a memory array where the supply voltage is reduced to 3.4 volts and where the power dissipated in the decoder is equal to 66.7 mW instead of 190 mW which is the power dissipated when using conventional resistor circuits.

Furthermore, the selection speed is increased as a result of the higher switching speed of the driver transistor.

While the invention has been particularly shown and described with reference to a preferred embodiment thereof, it will be understood by those skilled in the art that various changes in form and detail may be made therein without departing from the spirit and scope of the invention.

What is claimed is:

1. A selection circuit for a memory array having a matrix of cells arranged in n rows and m columns wherein the cells of different rows are connected to n word lines each having selected and non-selected states, the selection of a word line during a selected state being controlled by an address decoding circuit receiving at its input a line addressing signal and having n outputs, each output controlling the state of a line driver transistor, the n driver transistors being of a first conductivity type, each of which includes first and second electrodes and a control electrode, said first electrode being connected to a voltage supply terminal, said second electrode being connected to a word line and said control electrode being connected to an output of said decoding circuit, comprising;

n control transistors having a conductivity opposite to that of said driver transistors, each of said control transistors being associated with one of said driver transistors and having a first conductive electrode connected to said voltage supply terminal and a second conductive electrode connected to the control electrode of its associated driver transistor, and means including a regulating transistor for supplying a current to the control electrode of each of said control transistors during the selected and non-selected states of an associated word line.

2. A selection circuit as set forth in claim 1 wherein each of said driver transistors is of the NPN type and each of the control transistors is of the PNP type.

3. A selection circuit as set forth in claim 2 wherein the collectors of said driver transistors and the emitters of the control transistors are connected to said voltage supply terminal, the emitters of said driver transistors are connected to the word lines and the bases of said driver transistors are connected to the outputs of said decoding circuit and to the collectors of said control transistors.

4. A selection circuit for a memory array having a matrix of cells arranged in n rows and m columns wherein the cells of different rows are connected to n word lines, the selection of a word line being controlled by an address decoding circuit receiving at its input a line addressing signal and having n outputs, each output controlling the state of a line driver transistor, the n driver transistors each being of the NPN type, each of which includes a collector, an emitter and a base, said collector being connected to a voltage supply terminal, said emitter being connected to a word line and said base being connected to an output of said decoding circuit, comprising;
- n control transistors each being of the PNP type, each of said control transistors being associated with one of said driver transistors and having an emitter connected to said voltage supply terminal and a collector connected to the base of its associated driver transistor, and
- means for supplying a current to the control electrode of each of said control transistors, said means including a regulating transistor having a conductivity type similar to that of said control transistors and connected so as to form a current mirror with said control transistors, said regulating transistor having its base connected to the base of at least one of said control transistors, its emitter connected to said voltage supply terminal and its collector connected to its base and to a controllable current source.

5. A selection circuit as set forth in claim 4 wherein said control transistors are arranged into k groups of p elements, with $k \cdot p = n$ and with the bases of the control transistors of one group being interconnected, and further including k regulating transistors, each of said k regulating transistors having its base connected to the interconnected bases of one group of said control transistors.

6. A selection circuit as set forth in claim 5 further including a plurality of controllable current sources, each of said current sources being associated with a respective one of said regulating transistors, each of said current sources including a transistor having a first electrode connected to the collector of the associated regulating transistor, a second electrode connected via a resistor to a second voltage supply terminal and a control electrode connected to a generator producing a reference voltage.

7. A selection circuit as set forth in claim 6 wherein each current source transistor is an NPN type transistor having a collector connected to the collector of its associated regulating transistor, an emitter connected via said resistor to said second voltage supply terminal and a base connected to said reference voltage generator.

8. A selection circuit as set forth in claim 7 wherein said reference voltage generator includes
- a current mirror including first and second transistors of the same type and having similar characteristics to those of said control transistors, said first transistor having its base and collector interconnected and connected via a first resistor to said second voltage supply terminal and its emitter connected to said first voltage supply terminal, said second transistor having its base connected to the base of said first transistor, its emitter connected to said first voltage supply terminal and its collector connected via a second resistor to said second voltage supply terminal, said second resistor having a resistance value equal to that of said first resistor, and
- output circuit means coupled to the collector of said second transistor for generating said reference voltage.

* * * * *